(12) United States Patent
Zang

(10) Patent No.: US 10,290,639 B2
(45) Date of Patent: May 14, 2019

(54) VNW SRAM WITH TRINITY CROSS-COUPLE PD/PU CONTACT AND METHOD FOR PRODUCING THE SAME

(71) Applicant: GLOBALFOUNDRIES Inc., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/702,243

(22) Filed: Sep. 12, 2017

(65) Prior Publication Data

US 2019/0081049 A1   Mar. 14, 2019

(51) Int. Cl.
*H01L 21/8238* (2006.01)
*H01L 27/11* (2006.01)
(Continued)

(52) U.S. Cl.
CPC .... *H01L 27/1104* (2013.01); *H01L 21/28518* (2013.01); *H01L 21/823807* (2013.01); *H01L 21/823814* (2013.01); *H01L 21/823828* (2013.01); *H01L 21/823871* (2013.01); *H01L 21/823878* (2013.01); *H01L 21/823885* (2013.01); *H01L 21/823892* (2013.01); *H01L 23/535* (2013.01); *H01L 27/0925* (2013.01); *H01L 29/0653* (2013.01); *H01L 29/0676* (2013.01); *H01L 29/42392* (2013.01);
(Continued)

(58) Field of Classification Search
CPC ............... H01L 27/1104; H01L 23/535; H01L 21/823885; H01L 21/823878; H01L 21/823871; H01L 21/823828; H01L 21/823814; H01L 21/823807; H01L 21/28518; H01L 29/78618; H01L 29/78696; H01L 29/78642; H01L 29/42392; H01L 29/0676; H01L 29/0653; H01L 27/0925; H01L 21/823892; H01L 27/11; H01L 29/66666; H01L 29/7827; H01L 29/0657; H01L 29/7391; H01L 29/42356

See application file for complete search history.

(56) References Cited

U.S. PATENT DOCUMENTS 9,734,897 B1 *  8/2017  Zang ...................... G11C 11/419
9,786,557 B1 * 10/2017  Chi ..................... H01L 21/76897
(Continued)

*Primary Examiner* — Bitew A Dinke
(74) *Attorney, Agent, or Firm* — Ditthavong & Steiner, P.C.

(57) ABSTRACT

A method of forming a VNW SRAM device with a vertical cross-couple/PD/PU contact landed on a PD/PU gate and a bottom nRX and pRX interface and the resulting device are provided. Embodiments include forming a first and a second bottom nRX and pRX over an NW upon a p-sub, the pRX formed between the nRX; forming fins over the first nRX, the first pRX, the second pRX, and over the second nRX; forming a first GAA perpendicular to and over the second pRX and nRX, a second GAA perpendicular to and over the first nRX and pRX, a third GAA perpendicular to and over a portion the first nRX, and a fourth GAA perpendicular to and over a portion of the second nRX; and forming a first and a second metal gate contact on the first GAA, nRX, and pRX and on the second GAA, pRX, and nRX, respectively.

6 Claims, 11 Drawing Sheets

(51) Int. Cl.
    *H01L 27/092*     (2006.01)
    *H01L 29/06*     (2006.01)
    *H01L 29/423*     (2006.01)
    *H01L 29/786*     (2006.01)
    *H01L 23/535*     (2006.01)
    *H01L 21/285*     (2006.01)

(52) U.S. Cl.
    CPC .. *H01L 29/78618* (2013.01); *H01L 29/78642* (2013.01); *H01L 29/78696* (2013.01)

(56) References Cited

U.S. PATENT DOCUMENTS

| | | | |
|---|---|---|---|
| 9,799,661 B1* | 10/2017 | Zang | H01L 27/1104 |
| 9,824,748 B1* | 11/2017 | Zang | G11C 11/412 |
| 2004/0113207 A1 | 6/2004 | Hsu et al. | |
| 2009/0057722 A1* | 3/2009 | Masuoka | H01L 27/092 257/207 |
| 2010/0219483 A1* | 9/2010 | Masuoka | H01L 27/0207 257/369 |
| 2011/0018056 A1* | 1/2011 | Takeuchi | H01L 21/76895 257/329 |
| 2011/0062523 A1* | 3/2011 | Masuoka | H01L 21/82381 257/368 |
| 2011/0074498 A1* | 3/2011 | Thompson | H01L 21/82341 327/543 |
| 2013/0062673 A1* | 3/2013 | Masuoka | H01L 27/14614 257/291 |
| 2013/0270652 A1* | 10/2013 | Liaw | H01L 27/1104 257/401 |
| 2014/0117507 A1* | 5/2014 | Juengling | H01L 27/092 257/622 |
| 2014/0153323 A1* | 6/2014 | Liaw | H01L 27/0207 365/156 |
| 2014/0252455 A1* | 9/2014 | Chuang | H01L 27/11 257/329 |
| 2014/0264623 A1* | 9/2014 | Nandakumar | H01L 27/0928 257/371 |
| 2015/0179655 A1 | 6/2015 | Nakanishi et al. | |
| 2015/0187896 A1* | 7/2015 | Kamineni | H01L 29/41791 257/288 |
| 2015/0318290 A1* | 11/2015 | Liaw | H05K 999/00 257/329 |
| 2015/0349078 A1* | 12/2015 | Masuoka | H01L 29/78 257/351 |
| 2016/0078922 A1 | 3/2016 | Liaw | |
| 2016/0181390 A1* | 6/2016 | Liu | H01L 29/7851 257/407 |
| 2017/0125530 A1* | 5/2017 | Zhang | H01L 29/41791 |
| 2017/0373000 A1* | 12/2017 | Zhang | H01L 27/088 |

* cited by examiner

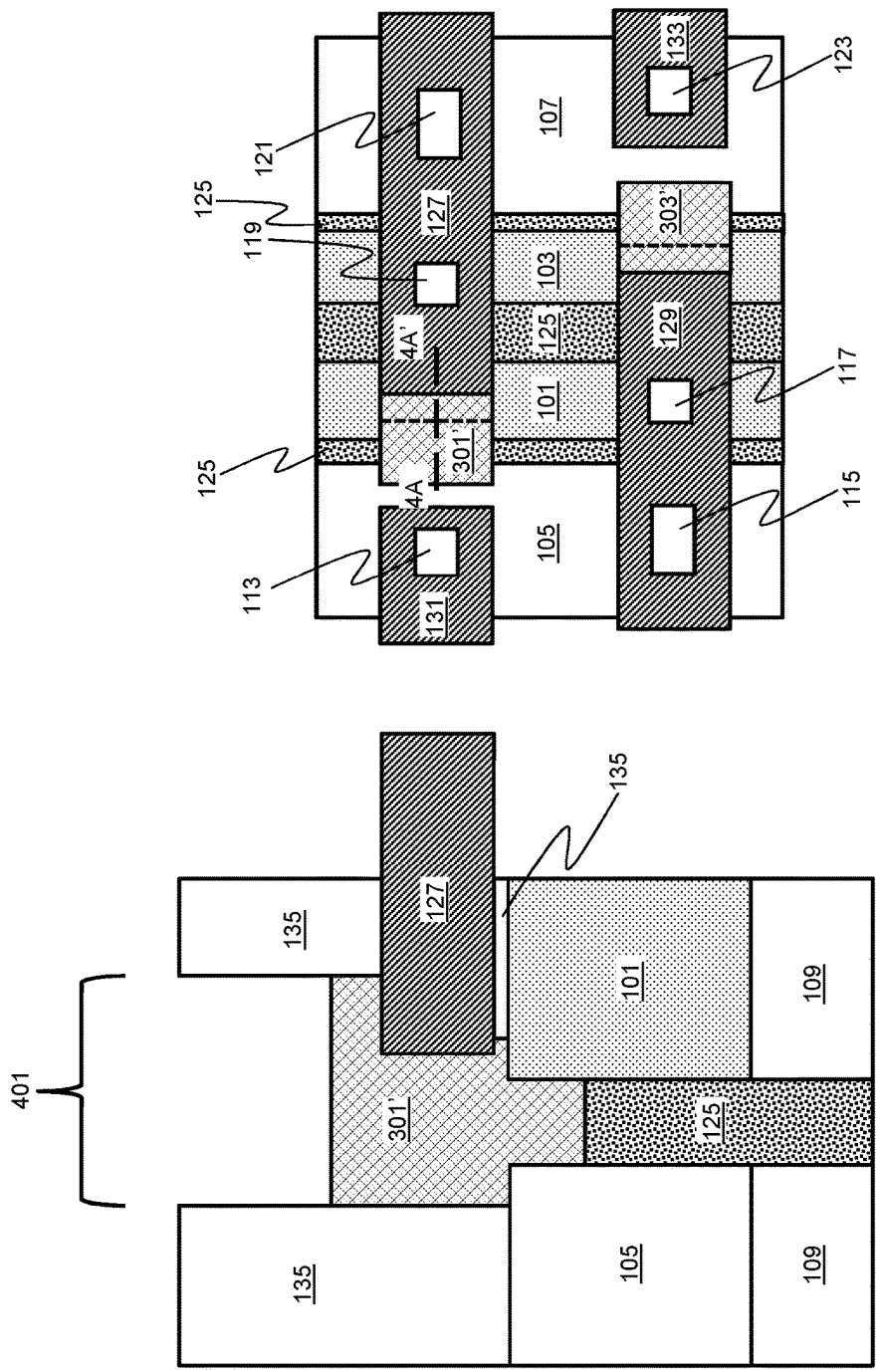

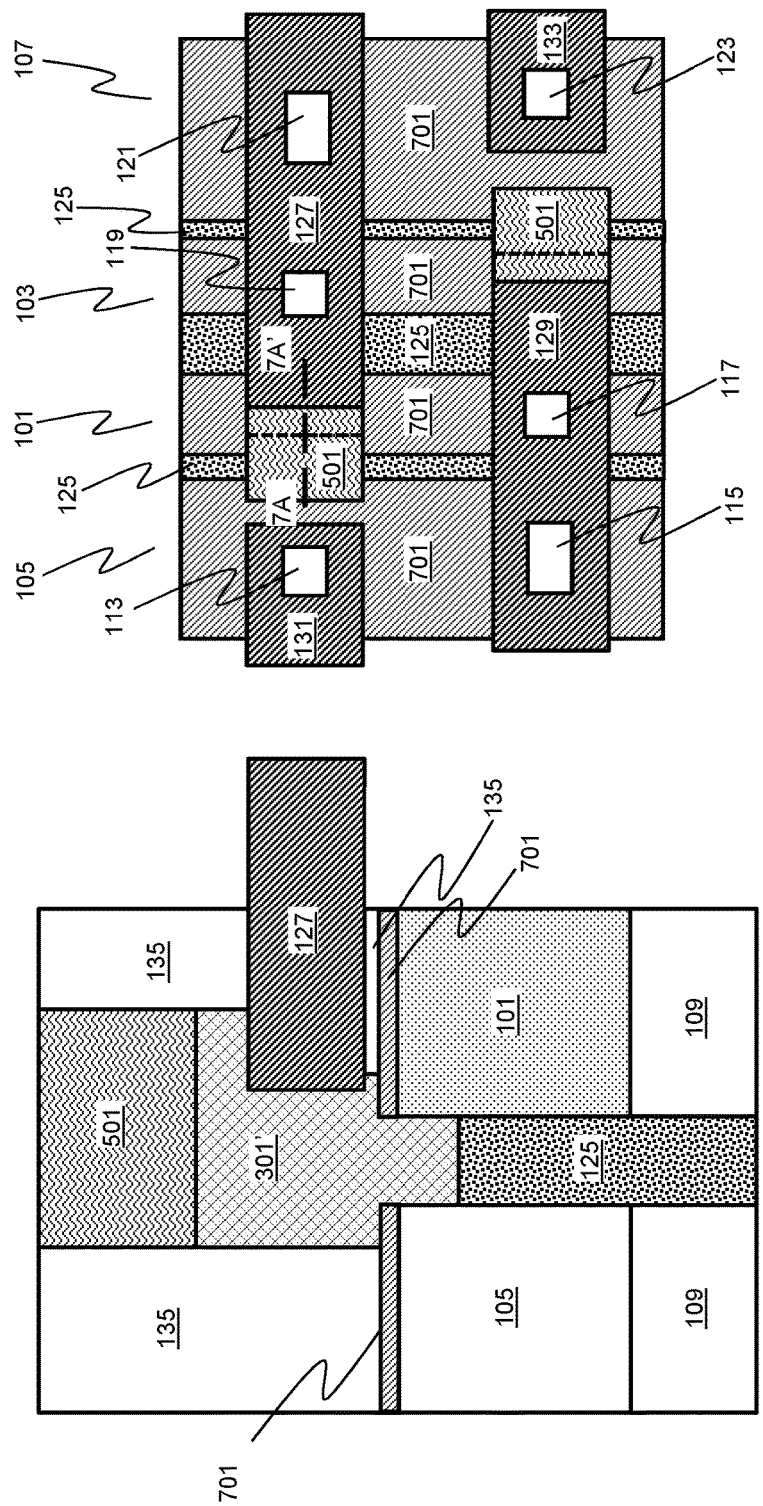

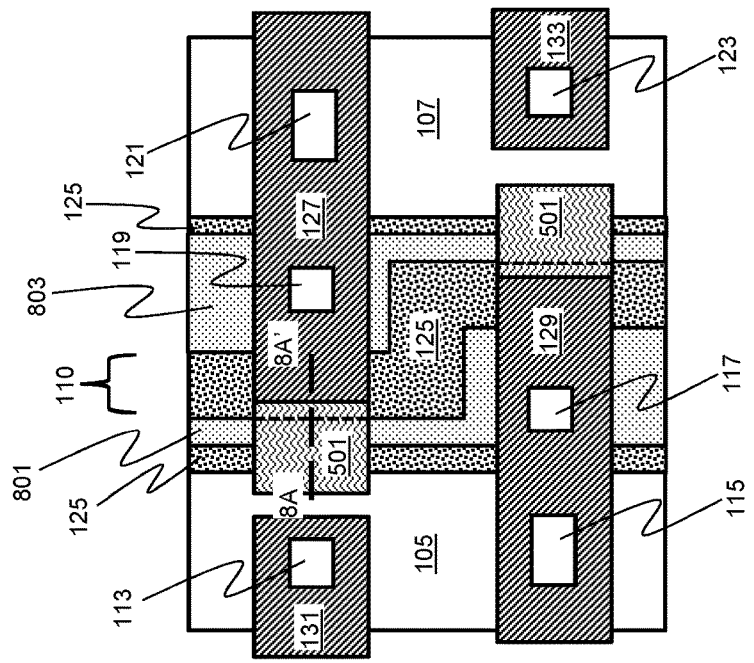
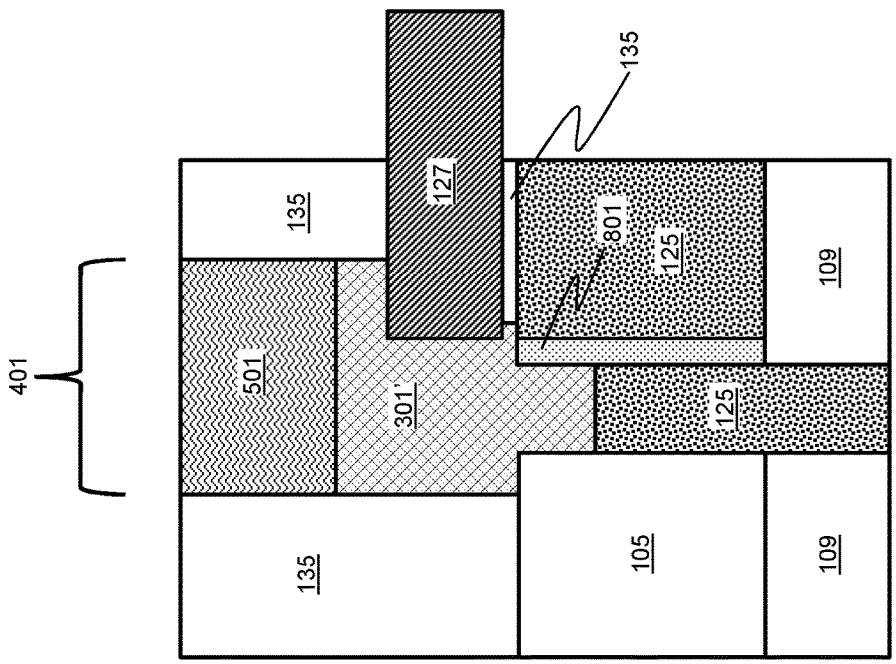
FIG. 8B
FIG. 8A

VNW SRAM WITH TRINITY CROSS-COUPLE PD/PU CONTACT AND METHOD FOR PRODUCING THE SAME

TECHNICAL FIELD

The present disclosure relates to the manufacture of static random-access memory (SRAM) semiconductor devices. The present disclosure is particularly applicable to a vertical gate-all-around (GAA) nanowire field-effect transistor (VFET) in the 5 nanometer (nm) technology node and beyond.

BACKGROUND

Cell scaling is of critical importance to continued improvement of complementary metal-oxide-semiconductor (CMOS) technology. A VFET is a promising device to enable device scaling beyond the 5 nm technology node. To achieve the requisite small SRAM cell, vertical nanowire (VNW) contacts are employed. However, forming vertical cross-couple gate contacts at this scale poses a number of known process and structural challenges.

A need therefore exists for methodology enabling formation of a cross-couple/pull down (PD) transistor/pullup (PU) transistor contact to achieve a small SRAM cell without the known process and structural challenges and the resulting device.

SUMMARY

An aspect of the present disclosure is method of forming a VNW SRAM device with a vertical cross-couple/PD/PU contact landed on a PD/PU gate and a bottom n-type active region (nRX) and p-type active region (pRX) interface.

Another aspect of the present disclosure is VNW SRAM device having a vertical cross-couple/PD/PU contact landed on a PD/PU gate and a bottom nRX and pRX interface.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first and a second bottom nRX and a first and a second bottom pRX over an n-type well (NW) upon a p-type substrate (p-sub), the first and second pRX formed between the first and second nRX; forming a first and a second fin laterally separated over the first nRX, a third fin over the first pRX, a fourth fin over the second pRX, and a fifth and a sixth fin laterally separated over the second nRX; forming a first GAA perpendicular to and over the second pRX and nRX and around the fourth and fifth fins, a second GAA perpendicular to and over the first nRX and pRX and around the second and third fins, a third GAA perpendicular to and over a portion the first nRX and around the first fin, and a fourth GAA perpendicular to and over a portion of the second nRX and around the sixth fin; and forming a first and a second metal gate contact on the first GAA, nRX, and pRX and on the second GAA, pRX, and nRX, respectively, the first and second metal gate contacts laterally separated from the third and fourth GAA, respectively.

Aspects of the present disclosure include forming the first nRX and pRX and the second nRX and pRX laterally separated from each other; forming a shallow trench isolation (STI) layer over the p-sub between the first nRX and pRX, first and second pRX, and the second nRX and pRX subsequent to the forming of the first, second, third, fourth, fifth, and sixth fins and prior to forming the first, second, third, and fourth GAA; recessing the STI layer below an upper surface of the first and second nRX and pRX; forming an oxide layer over the substrate subsequent to the forming of the first, second, third, and fourth GAA; forming a first and a second trench through the oxide layer down to the STI layer, adjacent portions of the first nRX and pRX and second pRX and nRX, and the first and second GAA, respectively; forming the first and second metal gate contacts in the first and second trenches, respectively; and planarizing the first and second metal gate contacts down to the second oxide layer. Other aspects include recessing the first and second metal gate contacts below an upper surface of the oxide layer subsequent to the planarizing, a third and a fourth trench formed, respectively; forming a low-K layer over the substrate and in the third and fourth trenches; and planarizing the low-K layer down to the oxide layer. Further aspects include forming a silicide layer on a portion of sidewalls of the first and second nRX and pRX prior to forming the STI layer, an upper surface of the silicide layer coplanar with the upper surface of the first and second nRX and pRX, or a silicide layer over the first and second nRX and pRX prior to forming the first, second, third, and fourth GAA.

Another aspect includes forming the first nRX and pRX and the second nRX and pRX adjacent to each other; forming a STI layer over the p-sub between the first and second pRX subsequent to the forming of the first, second, third, fourth, fifth, and sixth fins and prior to forming the first, second, third, and fourth GAA; forming an oxide layer over the substrate subsequent to the forming of the first, second, third, and fourth GAA; forming a first and a second trench through the oxide layer down to and over adjacent portions of the first nRX and pRX between the first and third GAA and down to and over adjacent portions of the second pRX and nRX between the second and fourth GAA, respectively; forming the first and second metal gate contacts in the first and second trenches, respectively; and planarizing the first and second metal gate contacts down to the oxide layer. Additional aspects include recessing the first and second metal gate contacts below an upper surface of the oxide layer subsequent to the planarizing, a third and a fourth trench formed, respectively; forming a low-K layer over the substrate and in the third and fourth trenches; and planarizing the low-K layer down to the oxide layer. Other aspects include forming a silicide layer over the first and second nRX and pRX prior to forming the first, second, third, and fourth GAA. Further aspects include forming a source/drain contact (CA) over each of the first, second, third, fourth, fifth, and six fins and a gate contact (CB) over a portion of each of the first and the second GAA subsequent to forming the first and second metal gate contacts.

Another aspect of the present disclosure is a device including: an NW over a p-sub; a first and a second bottom nRX and a first and a second bottom pRX over the NW, the first and second pRX between the first and second nRX; a first and a second fin laterally separated over the first nRX, a third fin over the first pRX, a fourth fin over the second pRX, and a fifth and a sixth fin laterally separated over the second nRX; a first GAA perpendicular to and over the second pRX and nRX and around the fourth and fifth fins, a second GAA perpendicular to and over the first nRX and pRX and around the second and third fins, a third GAA perpendicular to and over a portion of the first nRX and around the first fin, and a fourth GAA perpendicular to and over a portion of the second nRX and around the sixth fin; and a first and a second metal gate contact on portions of the first GAA, nRX, and pRX and on portions of the second GAA, pRX, and nRX, respectively, the first and second metal gate contacts laterally separated from the third and fourth GAA, respectively.

Aspects of the device include wherein the first nRX and pRX and the second nRX and pRX are laterally separated from each other, a first oxide layer over the NW between the first nRX and pRX and between the second nRX and pRX, an upper surface of the first oxide layer below an upper surface of the first and second nRX and pRX; and a second oxide layer over the substrate, an upper surface of the second oxide layer coplanar with an upper surface of the first and second metal gate contacts. Other aspects include a first oxide layer over the NW between the first nRX and pRX and between the second nRX and pRX, an upper surface of the first oxide layer below an upper surface of the first and second nRX and pRX; a low-k layer over the first and second metal gate contacts; and a second oxide layer over the substrate, an upper surface of the second oxide layer coplanar with an upper surface of the low-k layer. Further aspects include a silicide layer on a portion of sidewalls of the first and second nRX and pRX, an upper surface of the silicide layer coplanar with the upper surface of the first and second nRX and pRX, or a silicide layer over the first and second nRX and pRX. Additional aspects include wherein the first nRX and pRX and the second nRX and pRX are adjacent to each other, the device further comprising: a first oxide layer over the substrate, an upper surface of the second oxide layer coplanar with an upper surface of the first and second metal gate contacts. Another aspect includes a silicide layer over the first and second nRX and pRX. Other aspects include a STI layer over a portion of the p-sub between portions of the NW and first and second pRX. Further aspects include the first GAA being over a portion of the first pRX and the second GAA is over a portion of the second pRX. Additional aspects include a CA over each of the first, second, third, fourth, fifth, and six fins and a CB over a portion of each of the first and the second GAA.

A further aspect of the present disclosure is a method including: forming an NW over a substrate, the substrate with a first and a second lateral portion; forming a trench through the NW and a portion of the substrate between the first and second lateral portions; forming a first bottom nRX and a pRX over the NW in the first portion and a second bottom nRX and pRX over the NW in the second portion; forming a first and a second fin laterally separated over the first nRX, a third fin over the first pRX, a fourth fin over the second pRX, and a fifth and a sixth fin laterally separated over the second nRX; forming a STI layer in the trench and between each of the first nRX and pRX and the second nRX and pRX, and upper surface of the STI layer below an upper surface of the first and second nRX and pRX; forming a first GAA perpendicular to and over the second pRX and nRX and around the fourth and fifth fins, a second GAA perpendicular to and over a portion of the first nRX and pRX and around the second and third fins, a third GAA perpendicular to and over the first nRX and around the first fin, and a fourth GAA perpendicular to and over a portion of the second nRX and around the sixth fin; forming an oxide layer over the substrate; forming a first and a second trench through the oxide layer down to the STI layer over adjacent portions of the first nRX and pRX between the first and third GAA and over adjacent portions of the second pRX and nRX between the second and fourth GAA, respectively; forming a first and a second metal gate contact in the first and second trenches on portions of the first GAA, nRX, and pRX and on portions of the second GAA, pRX, and nRX, respectively; recessing the first and second metal gate contacts below an upper surface of the second oxide layer, a third and a fourth trench formed, respectively; forming a low-K layer over the substrate and in the third and fourth trenches; planarizing the low-K layer down to the second oxide layer; and forming a CA over each of the first, second, third, fourth, fifth, and six fins and a CB over a portion of each of the first and the second GAA.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 5A schematically illustrate cross-sectional views of a process flow for forming a VNW SRAM device with a vertical cross-couple/PD/PU contact landed on a PD/PU gate and a bottom nRX and pRX interface, in accordance with an exemplary embodiment;

FIG. 1B through 5B schematically illustrate top views of FIGS. 1A through 5A, respectively;

FIGS. 6A and 7A schematically illustrate cross-sectional views of the VNW SRAM device of FIG. 5A with a sidewall silicide or a silicide cap layer, respectively, in accordance with an exemplary embodiment;

FIGS. 6B and 7B schematically illustrate top views of FIGS. 6A and 7B, respectively;

FIGS. 8A and 8B schematically illustrate a VNW SRAM device with a vertical cross-couple/PD/PU contact landed on a PD/PU gate and a bottom nRX and pRX interface with a scaled pRX, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of forming sufficiently small cross-couple and gate contacts and electrically connecting p-type-n-type (p-n) junctions attendant upon forming a VNW SRAM device in the 5 nm technology node and beyond. The problems are solved, inter alfa, by forming a VNW SRAM device with a vertical cross-couple/PD/PU contact landed on a PD/PU gate and a bottom nRX and pRX interface.

Methodology in accordance with embodiments of the present disclosure includes forming a first and a second bottom nRX and a first and a second bottom pRX over an NW upon a p-sub, the first and second pRX formed between the first and second nRX. A first and a second fin are formed laterally separated over the first nRX, a third fin is formed over the first pRX, a fourth fin is formed over the second pRX, and a fifth and a sixth fin are formed laterally separated over the second nRX. A first GAA is formed perpendicular to and over the second pRX and nRX and around the fourth and fifth fins, a second GAA is formed perpendicular to and over the first nRX and pRX and around the second and third fins, a third GAA is formed perpendicular to and over a portion the first nRX and around the first fin, and a fourth GAA is formed perpendicular to and over a portion of the second nRX and around the sixth fin. A first and a second metal gate contact are formed on the first GAA, nRX, and pRX and on the second GAA, pRX, and nRX, respectively, the first and second metal gate contacts laterally separated from the third and fourth GAA, respectively.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
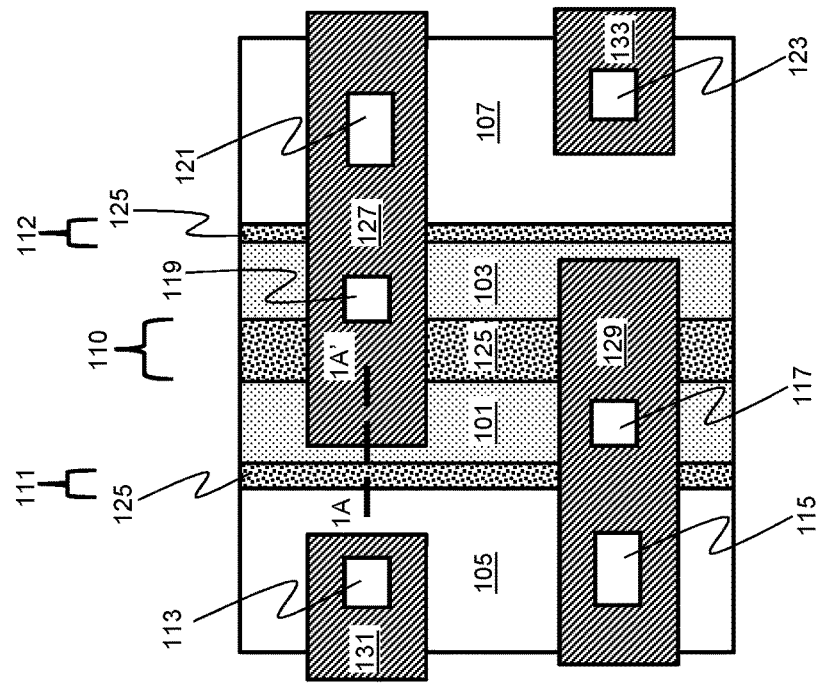
Figure 1A:
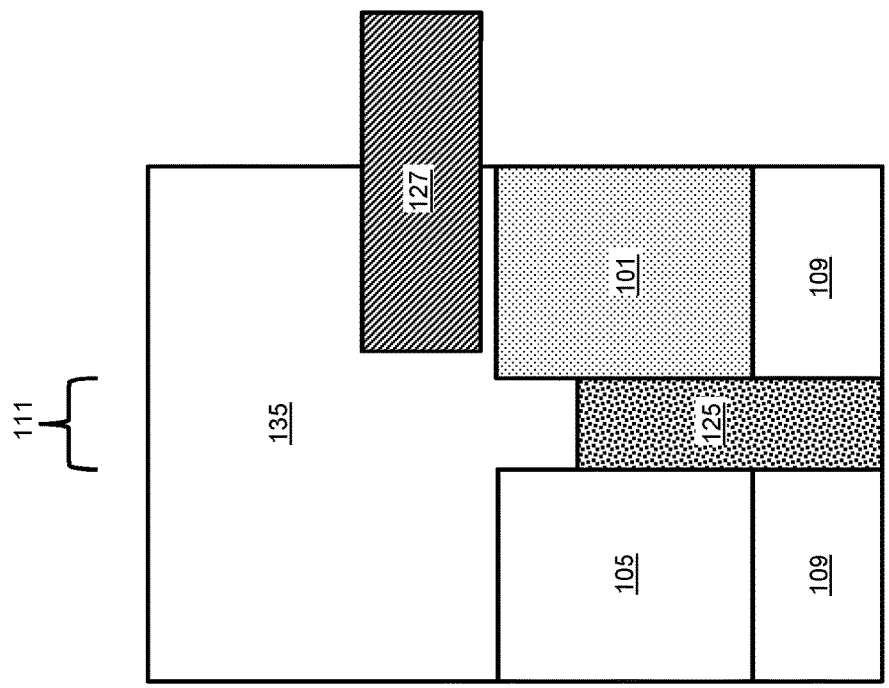

FIGS. 1A through 5A and 1B through 5B schematically illustrate a process flow for forming a VNW SRAM device with a vertical cross-couple/PD/PU contact landed on a PD/PU gate and a bottom nRX and pRX interface, in accordance with an exemplary embodiment. FIGS. 1B through 5B are top views and FIGS. 1A through 5A are cross-sectional views along the lines A-A', respectively. Referring to FIGS. 1A and 1B, bottom pRX 101 and 103 and bottom nRX 105 and 107 are formed, e.g., by a conventional implantation process, laterally separated over a NW 109 with the nRX 105 and pRX 101 on one side of a previously formed trench 110 in a p-sub (not shown for illustrative convenience) and the pRX 103 and nRX 107 formed on the opposite side of the trench 110. The trench 110 may be formed, e.g., to a width of 50 nm to 300 nm. In this instance, the nRX 105 and pRX 101 and the pRX 103 and nRX 107 are likewise separated by trenches 111 and 112, respectively, in the p-sub.

Fins 113, 115, 117, 119, 121, and 123 are then formed, e.g., by a standard fin formation process, over the nRX 105 and 107 and pRX 101 and 103. Specifically, fins 113 and 115 are formed laterally separated over the nRX 105; fin 117 is formed over the pRX 101; fin 119 is formed over the pRX 103; and fins 121 and 123 are formed laterally separated over the nRX 107. Next, an STI layer 125 is formed, e.g., of oxide, over the p-sub in the trench 110 and between the nRX 105 and pRX 101 and the pRX 103 and nRX 107 in trenches 111 and 112, respectively. The STI layer 125 is then recessed, e.g., by etching, below an upper surface of the nRX 105 and pRX 101 and the pRX 103 and nRX 107.

Next, GAA 127, 129, 131, and 133 are formed, e.g., by a standard GAA formation process, such that GAA 127 is formed perpendicular to and over the nRX 107 and pRX 103 and 101 and around the fins 119 and 121; GAA 129 is formed perpendicular to and over nRX 105 and pRX 101 and 103 and around fins 115 and 117; GAA 131 is formed perpendicular to and over nRX 105 and around gate 113; and GAA 133 is formed perpendicular to and over nRX 107 and around gate 123. In this instance, GAA 127 and 129 are common GAA structures cross-coupling a PU (fin 119) and a PD (fin 121) and a PU (fin 117) and a PD (fin 115), respectively, and GAA 131 and 133 are pass gate (PG) transistors (fins 113 and 123, respectively). An oxide layer 135 is then formed over the p-sub and planarized, e.g., by chemical mechanical polishing (CMP).

Figure 2B:
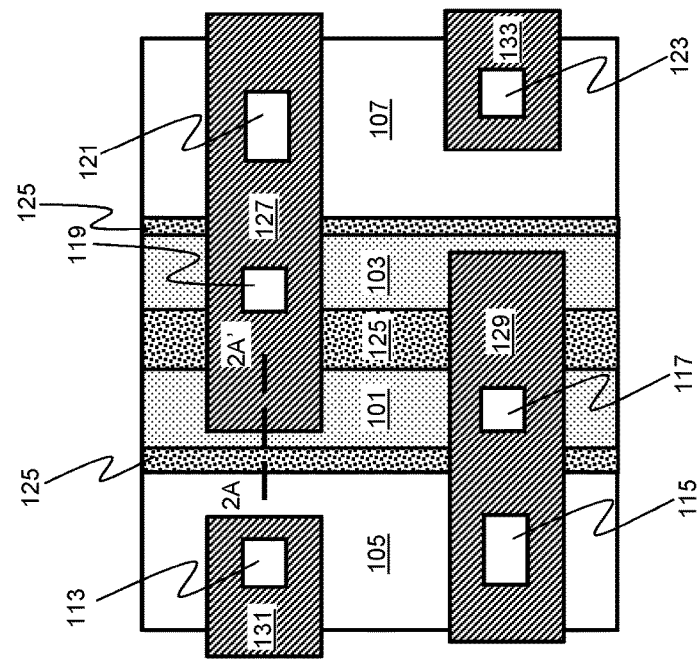
Figure 2A:
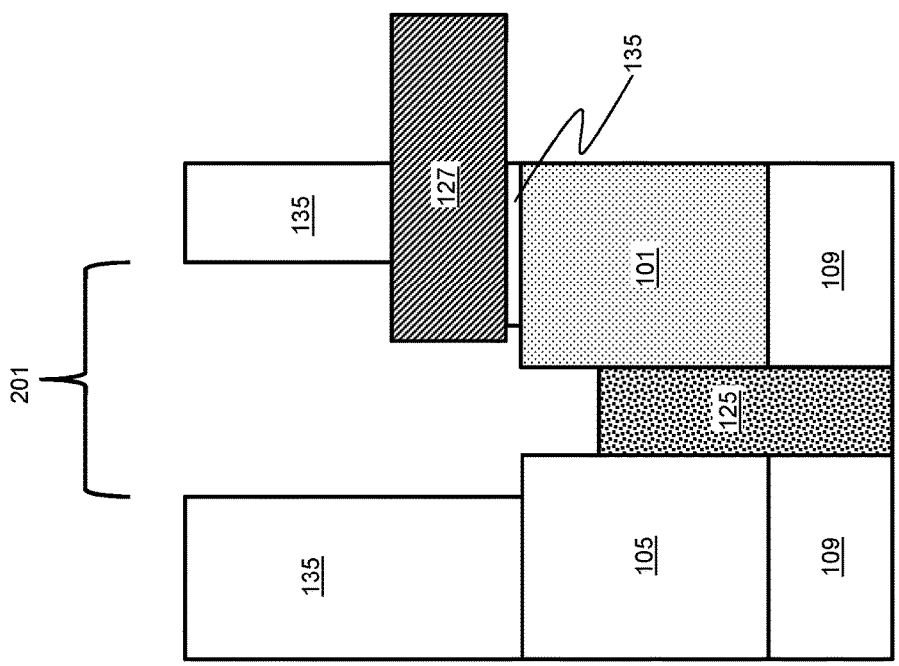

A trench 201 is then formed, e.g., by lithography and reactive-ion etching (RIE), through the oxide layer 135 down to the STI layer 125, adjacent portions of the nRX 105 and pRX 101, and the GAA 127, as depicted in FIG. 2A. At the same time, a trench 203 (not shown for illustrative convenience) is similarly formed down to the STI layer 125, adjacent portions of the nRX 107 and pRX 103, and the GAA 129

Figure 3B:
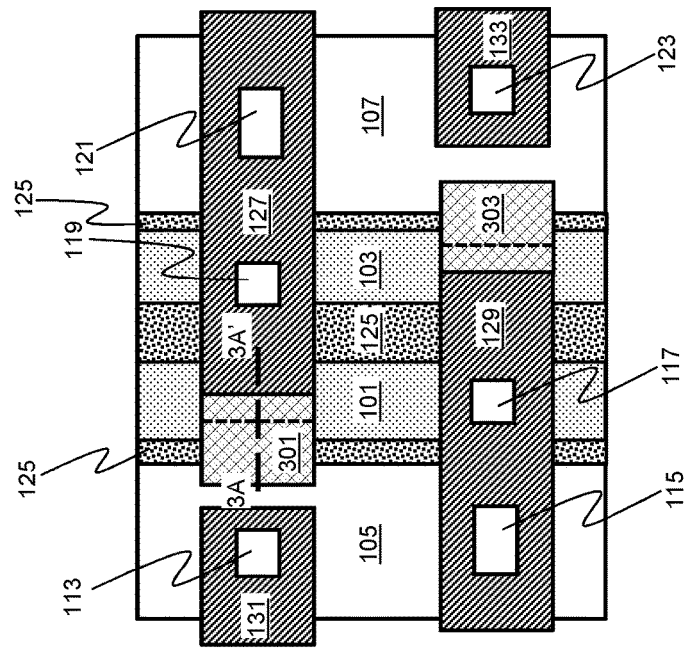
Figure 3A:
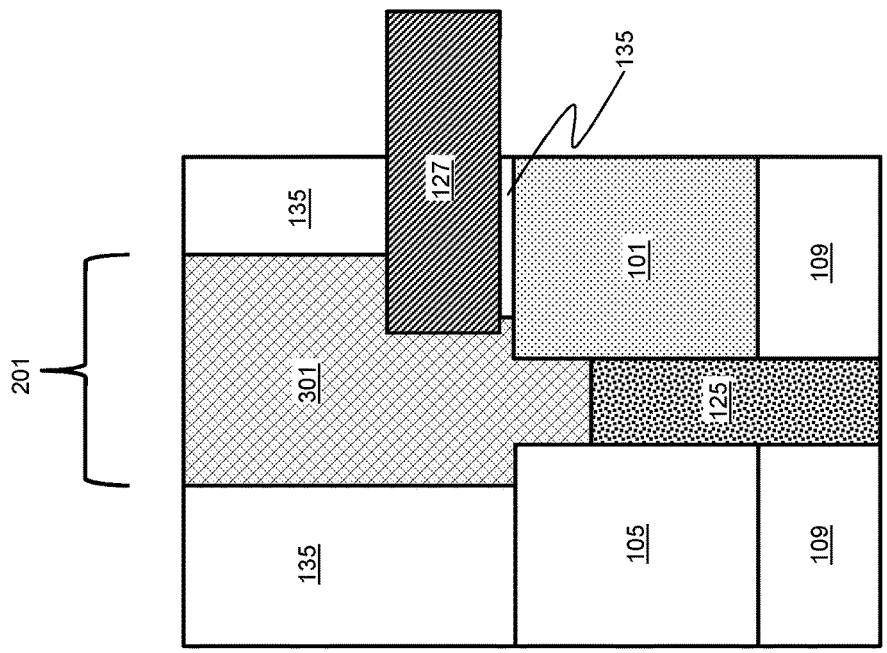

Referring to FIGS. 3A and 3B, metal gate contacts 301 and 303 are formed, e.g., of a titanium (Ti)/titanium nitride (TiN) liner and tungsten (W), in the trenches 201 and 203, respectively, and then planarized, e.g., by CMP, down to the oxide layer 135. Thereafter, a middle-of-the-line (MOL) CA (not shown for illustrative convenience) is formed over each fin 113, 115, 117, 119, 121, and 123 and a CB (not shown for illustrative convenience) is formed over a portion of each of GAA 127 and 129. Consequently, the metal gate contacts 301 and 303 are landed on the PD/PU GAA 127 and bottom nRX 105 and pRX 101 interface and the PD/PU GAA 129 and bottom nRX 107 and pRX 103 interface, respectively.

Figure 5A:
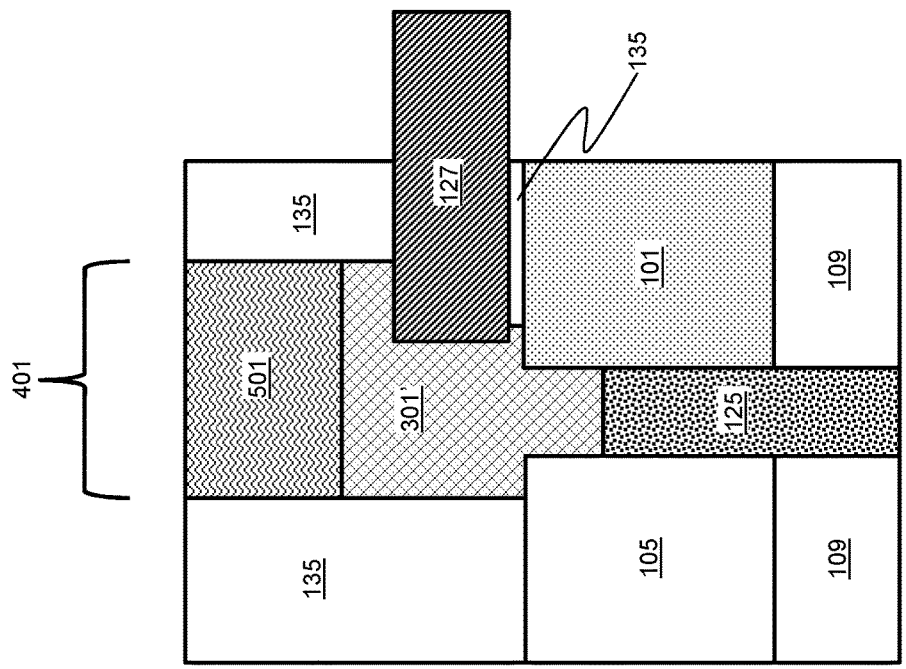
Figure 5B:
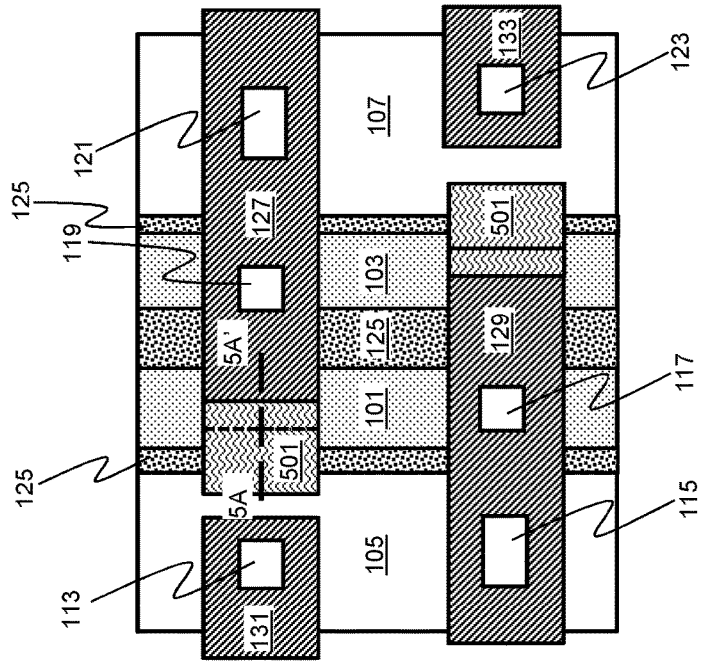

Alternatively, the metal gate contacts 301 and 303 may be recessed, e.g., 10 nm to 50 nm, below an upper surface of the oxide layer 135, forming metal gate contact 301' and trench 401 and metal gate contact 303' and trench 403 (not shown for illustrative convenience), as depicted in FIGS. 4A and 4B. A low-k layer 501 may then be formed over the metal gate contacts 301' and 303' in the trenches 401 and 403, respectively, and planarized, e.g., by CMP, down to the oxide layer 135, as depicted in FIGS. 5A and 5B. Thereafter, the MOL CA and CB described above with respect to FIGS. 3A and 3B (again not shown for illustrative convenience) are formed over each fin 113, 115, 117, 119, 121, and 123 and over a portion of GAA 127 and 129, respectively.

Figure 6B:
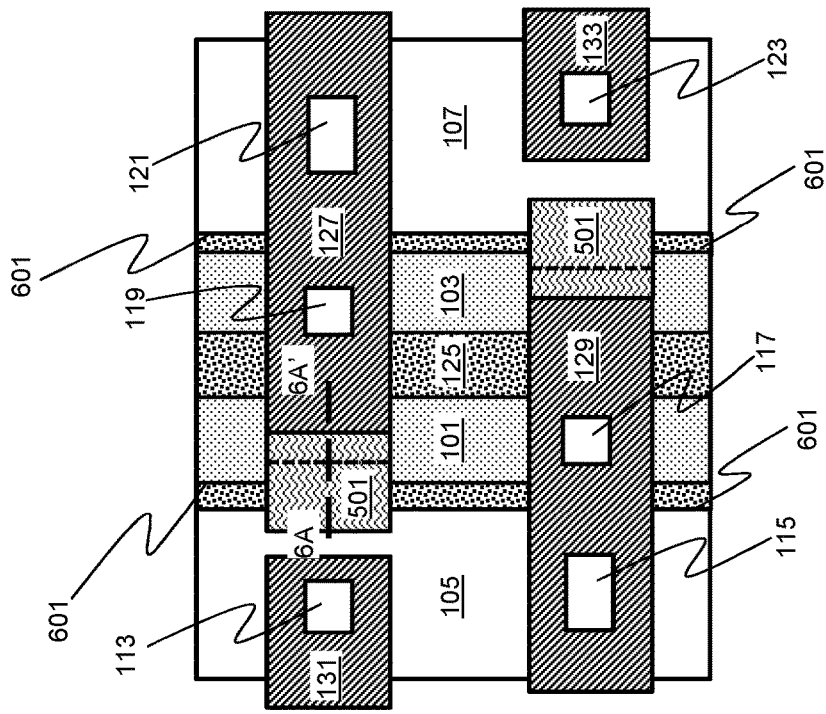
Figure 6A:
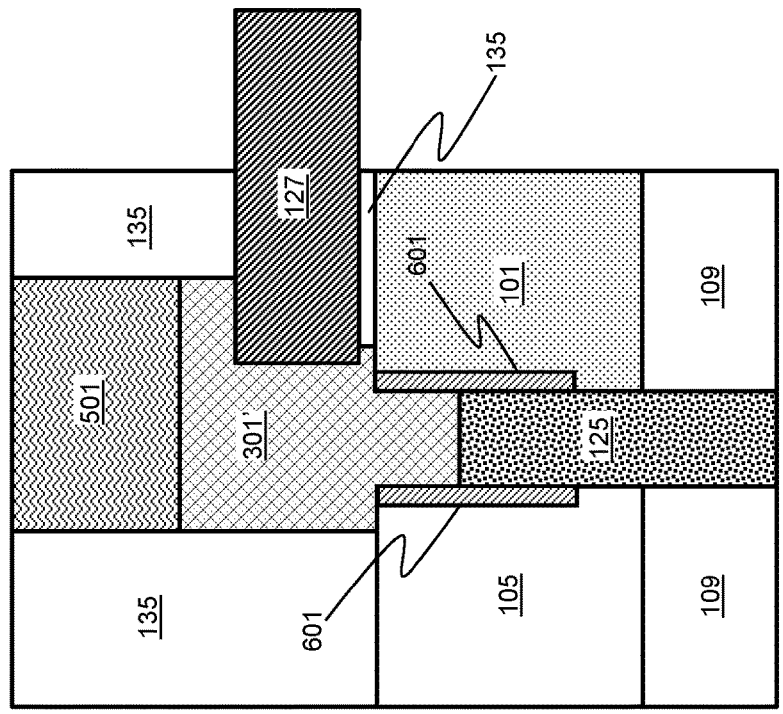

FIGS. 6A through 7A and 6B through 7B schematically illustrate the VNW SRAM device of FIGS. 5A and 5B with sidewall silicide or a silicide cap layer, respectively, in accordance with an exemplary embodiment. FIGS. 6B through 7B are top views, and FIGS. 6A through 7A are cross-sectional views along the lines A-A', respectively. The devices of FIGS. 6A through 7A and 6B through 7B are similar to the devices of FIGS. 5A and 5B, except for the addition of the respective silicide. Referring to FIGS. 6A and 6B, a silicide layer 601 is conventionally formed, e.g., to a thickness of 5 nm to 30 nm, on the sidewalls of the nRX 105, pRX 101, pRX 103, and nRX 107 prior to forming the STI layer 125. The silicide layer 601 is formed such that a resultant upper surface of the silicide layer 601 is coplanar with the upper surface of the nRX 105, pRX 101, pRX 103, and nRX 107. Alternatively, a silicide layer 701 may be conventionally formed, e.g., to a thickness of 5 nm to 30 nm, over the nRX 105, pRX 101, pRX 103, and nRX 107 prior to forming the GAA 127, 129, 131, and 133, as depicted in FIGS. 7A and 7B.

FIGS. 8A and 8B schematically illustrate a VNW SRAM device with a vertical cross-couple PD/PU contact landed on a PD/PU gate and a bottom nRX and pRX interface with scaled bottom pRX, in accordance with an exemplary embodiment. FIG. 8B is a top view and FIG. 8A is a cross-sectional view along the line A-A'. The device of FIGS. 8A and 8B is similar to the device of FIGS. 5A and 5B, except that in this instance, the pRX 801 and pRX 803 are scaled such that the GAA 127 is only formed over the nRX 107 and the pRX 803 and the GAA 129 is only formed over the nRX 105 and the pRX 801. It is contemplated that the sidewall silicide 601 of FIGS. 6A and 6B and the silicide layer 701 of FIGS. 7A and 7B could also be formed with respect to the device of FIGS. 8A and 8B.

Figures 9A, 9B:
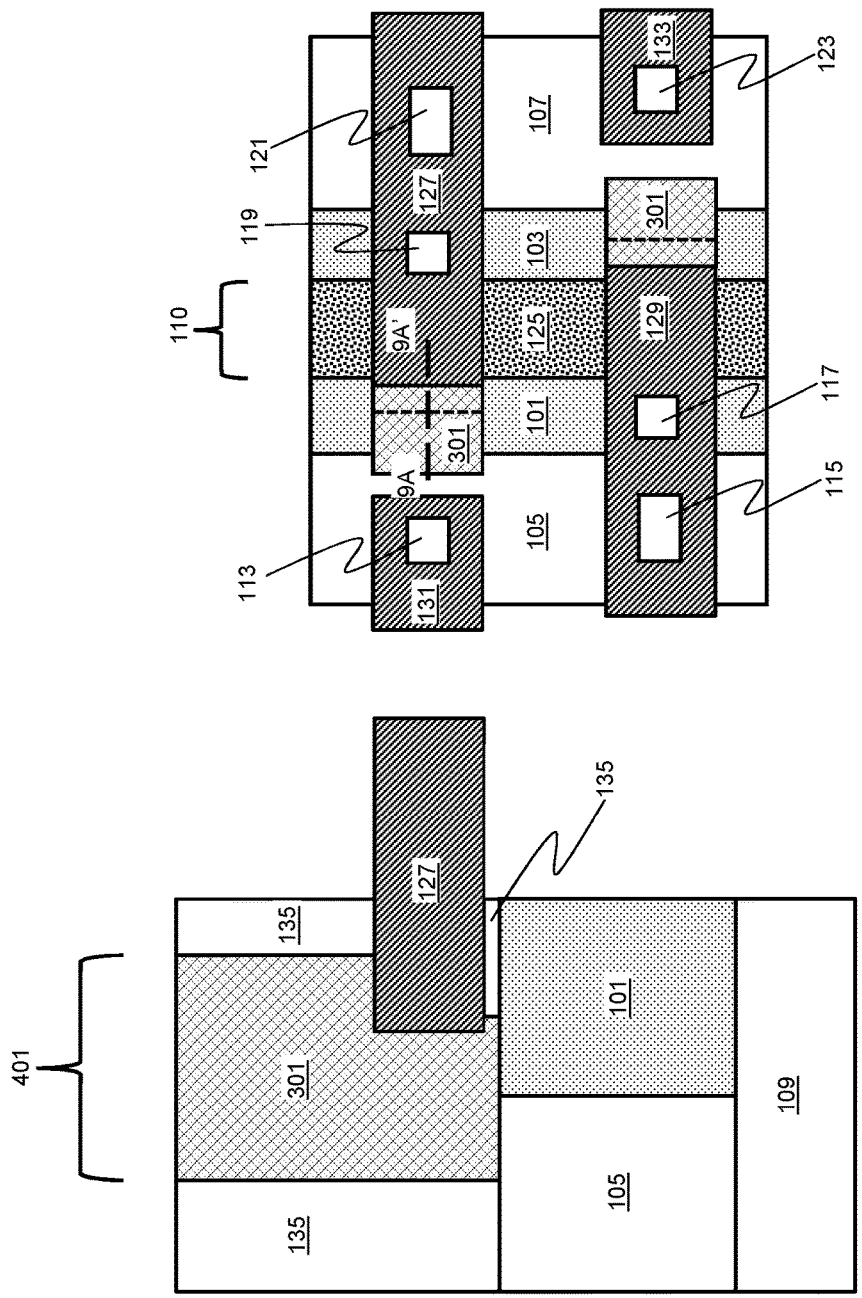
FIGS. 9A and 10A schematically illustrate cross-sectional views of a VNW SRAM device with a vertical cross-couple/PD/PU contact landed on a PD/PU gate and a bottom nRX and pRX interface, in accordance with another exemplary embodiment.
FIGS. 9B and 10B schematically illustrate top views of FIGS. 9A and 10A, respectively.
Figures 10A, 10B:
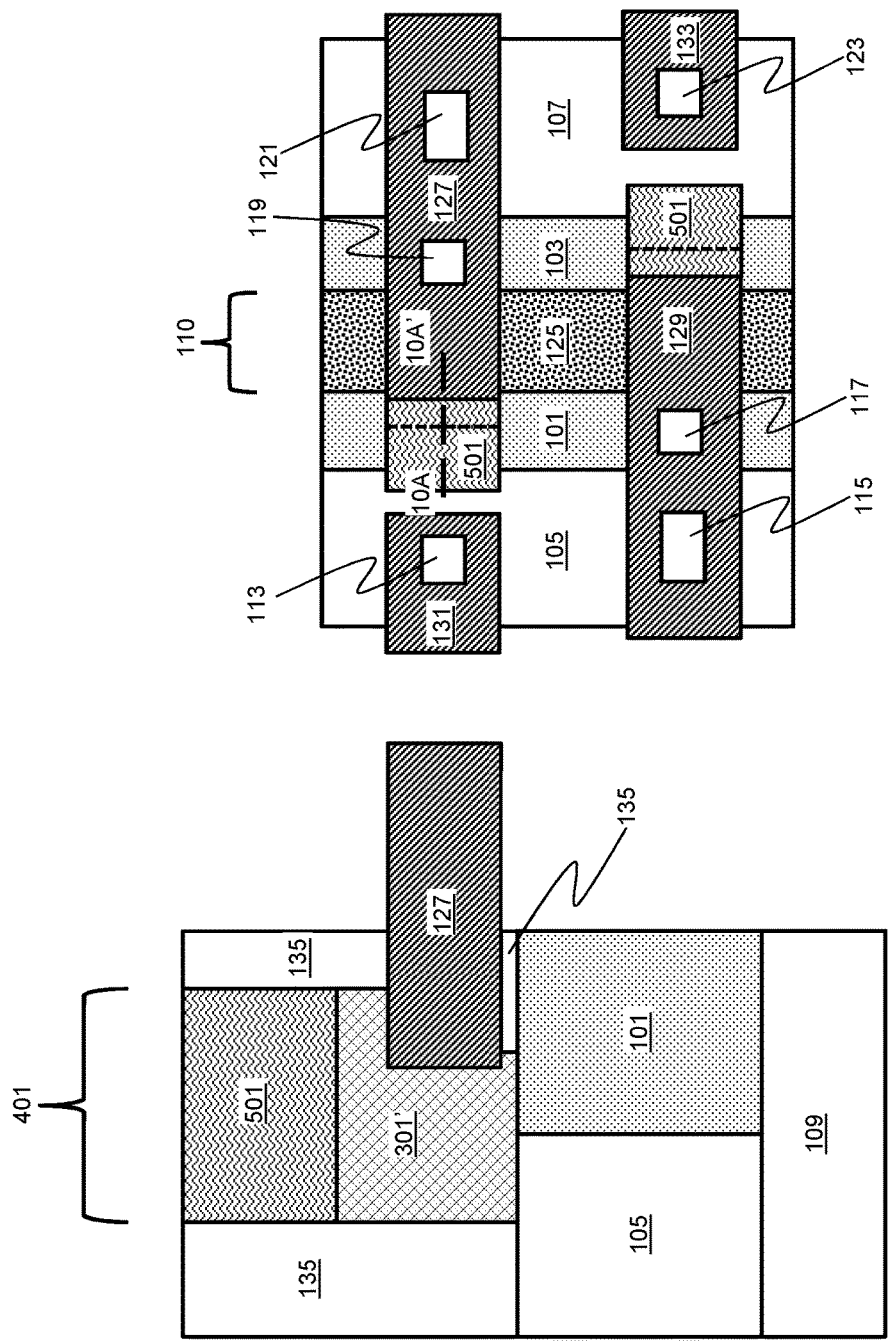

FIGS. 9A through 10A and 9B through 10B schematically illustrate a VNW SRAM device with a vertical cross-couple/PD/PU contact landed on a PD/PU gate and a bottom nRX and pRX interface, in accordance with another exemplary embodiment. FIGS. 9B and 10B are top views and FIGS. 9A and 10A are cross-sectional views along the lines A-A', respectively. Further, the devices of FIGS. 9A through 10A and 9B through 10B are similar to the devices of FIGS. 3A and 3B and 5A and 5B, respectively, except that in this instance, the nRX 105 and pRX 101 and pRX 103 and nRX are formed adjacent to each other and the STI layer 125 is only formed in the trench 110 between the pRX 101 and 103. Upon formation of the STI layer 125 between the pRX 101 and 103, the subsequent process flow is the same as described with respect to FIGS. 1A through 5A and 1B through 5B. In addition, it is contemplated that the silicide cap layer of FIGS. 7A and 7B could also be formed over the nRX 105, pRX 101, pRX 103, and nRX 107 and/or the pRX 101 and 103 could be scaled as described with respect to FIGS. 8A and 8B.

Figure 11:
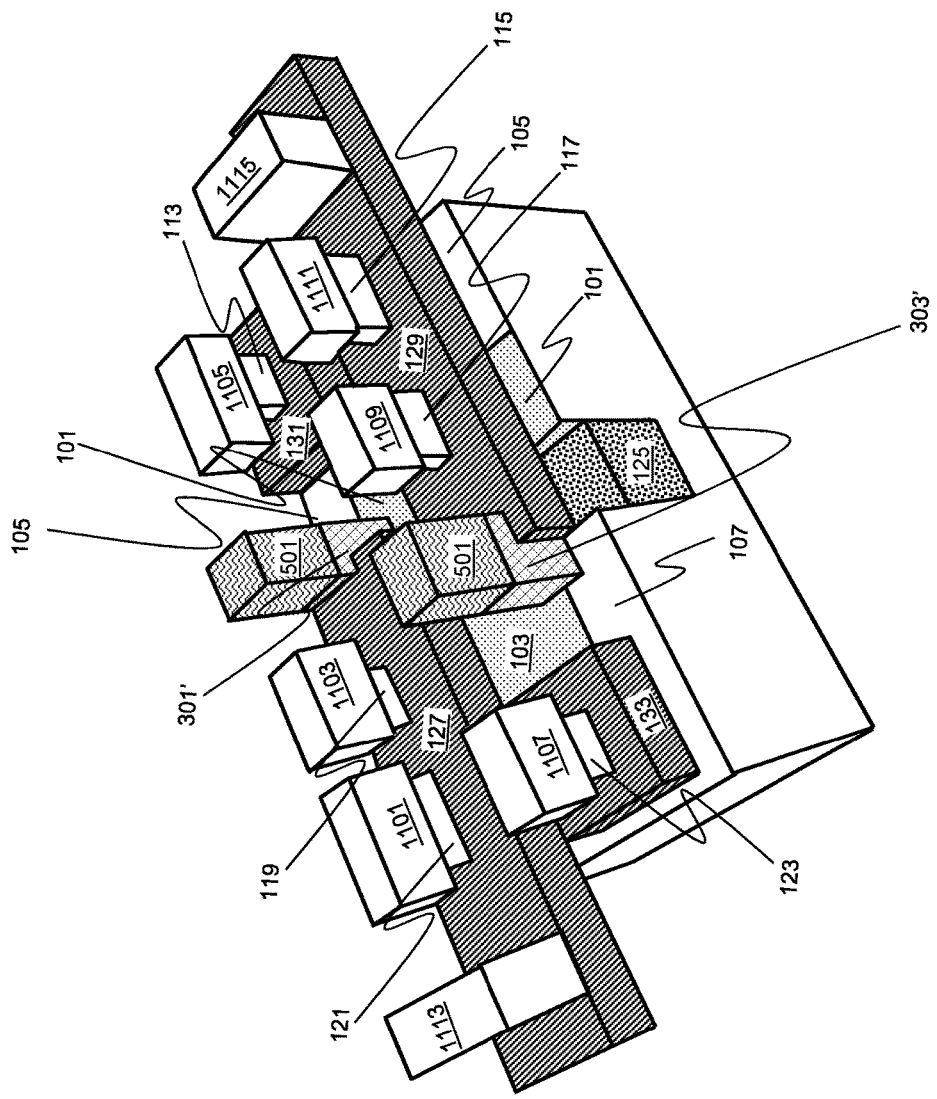
FIG. 11 is a schematic axiomatic illustration of FIGS. 10 and 10B, in accordance with an exemplary embodiment.

FIG. 11 is a schematic axiomatic illustration of FIGS. 10A and 10B, in accordance with an exemplary embodiment. Referring to FIG. 11, MOL CA 1101, 1103, 1105, 1107, 1109, and 1111 are formed, e.g., to a thickness of 10 nm to 50 nm, over the fins 121, 119, 113, 123, 117, and 115, respectively, and CB 1113 and 1115 are formed over a portion of the GAA 127 and 129, respectively, subsequent to forming the metal gate contacts 301' and 303'. As with a conventional six transistor (6T) SRAM layout, the CA 1101 is connected to a voltage source (Vss)(not shown for illustrative convenience) and one of the two PD transistors of the device; CA 1103 is connected to a voltage drain (Vdd)(not shown for illustrative convenience) and one of the two PU transistors of the device; and CA 1105 is connected to one bitline (BL) (not shown for illustrative convenience) and one of the two pass-gate (PG) transistors of the device. Similarly, CA 1107 is connected to another bitline (BL') (not shown for illustrative convenience) and the second of the two PG transistors; CA 1109 is connected to the Vdd and the second of the two PU transistors; and CA 1111 is connected to the Vss and the second of the two PD transistors. In addition, CB 1113 and 1115 are connected to a wordline (WL) (not shown for illustrative convenience). Consequently, the metal gate contacts 301' and 303' form a cross-couple PD/PU contact structure landed on the PD/PU GAA 127 and 129 and the bottom nRX and pRX interfaces 105/101 and 107/103, respectively.

The embodiments of the present disclosure can achieve several technical effects including forming a sufficiently small vertical cross-couple PD/PU connection and electrically connecting p-n junctions without known process and structural challenges. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with a vertical GAA VFET in the 5 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first and a second bottom n-type active region (nRX) and a first and a second bottom p-type active region (pRX) over an n-type well (NW) upon a p-type substrate (p-sub), the first and second pRX formed between the first and second nRX and the first nRX and pRX and the second nRX and pRX laterally separated from each other;
   forming a first and a second fin laterally separated over the first nRX, a third fin over the first pRX, a fourth fin over the second pRX, and a fifth and a sixth fin laterally separated over the second nRX;
   forming a first gate all around (GAA) perpendicular to and over the second pRX and nRX and around the fourth and fifth fins, a second GAA perpendicular to and over the first nRX and pRX and around the second and third fins, a third GAA perpendicular to and over a portion the first nRX and around the first fin, and a fourth GAA perpendicular to and over a portion of the second nRX and around the sixth fin;
   forming a first and a second metal gate contact on the first GAA, nRX, and pRX and on the second GAA, pRX, and nRX, respectively, the first and second metal gate contacts laterally separated from the third and fourth GAA, respectively;
   forming a shallow trench isolation (STI) layer over the p-sub between the first nRX and pRX, first and second pRX, and the second nRX and pRX;
   forming an oxide layer over the substrate;
   forming a first and a second trench through the oxide layer down to the STI layer;
   forming the first and second metal gate contacts in the first and second trenches, respectively;
   recessing the first and second metal gate contacts below an upper surface of the oxide layer subsequent to the planarizing, a third and a fourth trench formed, respectively;
   forming a low-K layer over the substrate and in the third and fourth trenches; and
   planarizing the low-K layer down to the oxide layer.

2. The method according to claim 1, further comprising:
forming the shallow trench isolation (STI) layer subsequent to the forming of the first, second, third, fourth, fifth, and sixth fins and prior to the forming of the first, second, third, and fourth GAA;
recessing the STI layer below an upper surface of the first and second nRX and pRX;
forming the oxide layer over the substrate subsequent to the forming of the first, second, third, and fourth GAA;
forming first and second trench adjacent portions of the first nRX and pRX and second pRX and nRX, and the first and second GAA, respectively; and
planarizing the first and second metal gate contacts down to the oxide layer.

3. The method according to claim 2, further comprising forming a silicide layer on a portion of sidewalls of the first and second nRX and pRX prior to forming the STI layer, an upper surface of the silicide layer coplanar with the upper surface of the first and second nRX and pRX, or a silicide layer over the first and second nRX and pRX prior to forming the first, second, third, and fourth GAA.

4. The method according to claim 1, comprising forming the first GAA over a portion of the first pRX and the second GAA over a portion of the second pRX.

5. The method according to claim 1, further comprising forming a source/drain contact (CA) over each of the first, second, third, fourth, fifth, and six fins and a gate contact (CB) over a portion of each of the first and the second GAA subsequent to forming the first and second metal gate contacts.

6. A method comprising:
forming an n-type well (NW) over a substrate;
forming a trench through the NW and a portion of the substrate;
forming a first bottom n-type active region (nRX) and a p-type active region (pRX) over the NW in the first portion and a second bottom nRX and pRX over the NW in the second portion;
forming a first and a second fin laterally separated over the first nRX, a third fin over the first pRX, a fourth fin over the second pRX, and a fifth and a sixth fin laterally separated over the second nRX;
forming a shallow trench isolation (STI) layer in the trench and between each of the first nRX and pRX and the second nRX and pRX, and upper surface of the STI layer below an upper surface of the first and second nRX and pRX;
forming a first gate all around (GAA) perpendicular to and over the second pRX and nRX and around the fourth and fifth fins, a second GAA perpendicular to and over a portion of the first nRX and pRX and around the second and third fins, a third GAA perpendicular to and over the first nRX and around the first fin, and a fourth GAA perpendicular to and over a portion of the second nRX and around the sixth fin;
forming an oxide layer over the substrate;
forming a first and a second trench through the oxide layer down to the STI layer over adjacent portions of the first nRX and pRX between the first and third GAA and over adjacent portions of the second pRX and nRX between the second and fourth GAA, respectively;
forming a first and a second metal gate contact in the first and second trenches on portions of the first GAA, nRX, and pRX and on portions of the second GAA, pRX, and nRX, respectively;
recessing the first and second metal gate contacts below an upper surface of a second oxide layer, a third and a fourth trench formed, respectively;
forming a low-K layer over the substrate and in the third and fourth trenches;
planarizing the low-K layer down to the second oxide layer; and
forming a source/drain contact (CA) over each of the first, second, third, fourth, fifth, and six fins and a gate contact (CB) over a portion of each of the first and the second GAA.

\* \* \* \* \*